United States Patent

[11] 3,588,743

[72] Inventors Tore Torstensson Fjallbrant Goteborg; Bernt Ingvar Hagerlof, Molndal, Sweden
[21] Appl. No. 815,959
[22] Filed Apr. 14, 1969
[45] Patented June 28, 1971
[73] Assignee Telefonaktiebolaget L M Ericsson Stockholm, Sweden
[32] Priority May 2, 1968
[33] Sweden
[31] 5922/68

[54] VARIABLE FREQUENCY TRANSISTOR R-C FEEDBACK OSCILLATOR
1 Claim, 2 Drawing Figs.

[52] U.S. Cl. .......... 331/108, 331/137, 331/140
[51] Int. Cl. .......... H03b 5/24
[50] Field of Search .......... 331/108, 108.4, 110, 135—137, 140

[56] References Cited
UNITED STATES PATENTS

| | | | |
|---|---|---|---|
| 2,439,245 | 4/1948 | Dunn | 331/140 |
| 2,764,643 | 9/1956 | Sulzer | 331/110 |

*Primary Examiner*—John Kominski
*Assistant Examiner*—Siegfried H. Grimm
*Attorney*—Hane and Baxley

ABSTRACT: There is disclosed an inductorless oscillator utilizing only two capacitors, a transistor and a plurality of resistors in a feedback path. By making one of the resistors variable the frequency of oscillation can be changed without changing the harmonic distortion of the oscillator.

INVENTORS
TORE TORSTENSSON FJÄLLBRANT
BERNT INGVAR HÄGERLÖF

BY Hane and Baxley
ATTORNEYS

VARIABLE FREQUENCY TRANSISTOR R-C FEEDBACK OSCILLATOR

The present invention relates to an oscillator, the frequency of which can be varied without increasing the harmonic distortion.

Oscillators without inductances generally comprise an amplifier with an 180° phase shifting network as a feedback network, i.e., a so-called phase shift oscillator. The phase shifting network consists usually of a ladder network including at least three capacitors and three resistors, the frequency being determined by the component values of these passive elements. In order to vary the frequency continuously it is required that several component values are changed simultaneously. However these changes result in changes of the harmonic distortion of the oscillator. An object of the present invention is therefore to provide an inductorless oscillator requiring only two capacitors and whose frequency may be changed continuously with constant harmonic distortion by changing the value of only one passive element. The characteristics of the invention appear from the claim following after the description.

Figure 1:
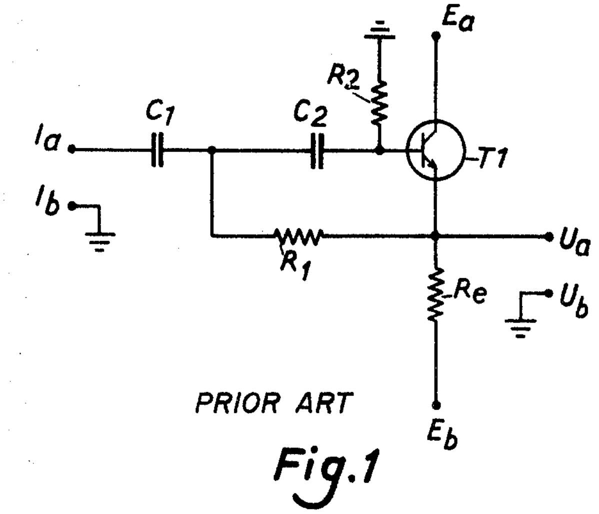
Figure 2:
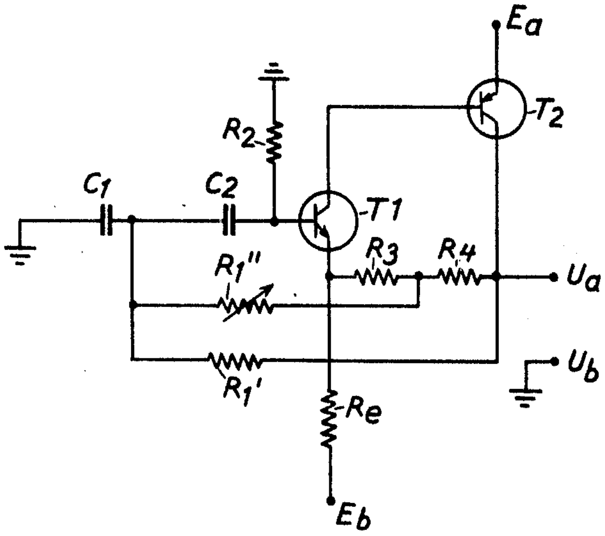

The invention will be explained more in detail with reference to the accompanying drawing where FIG. 1 shows a known high pass filter by means of which the operation of the oscillator according to the invention can be explained, and FIG. 2 shows an oscillator in accordance with the invention.

The high pass filter shown in FIG. 1 is in principle described in ELECTRONICS, Apr. 10, 1959, pages 68—70. In FIG. 1 T1 denotes an emitter follower connected transistor, the collector of which is connected to the positive pole E*a* of a direct voltage source and the emitter of which is connected to the negative pole E*b* of the direct voltage source via an emitter resistance R*e*. The base of the transistor is, on the one hand, connected to one input terminal I*a* of the filter, via two series connected capacitors C1 and C2, and, on the other, connected to ground via a resistor R2. Moreover the connection point of the capacitors is connected, via resistor R1, to the emitter of the transistor, which emitter constitutes one output terminal U*a* of the filter. The other input- and output terminals of the filter I*b* and U*b*, respectively, are connected to ground. In accordance with the above-mentioned article this filter has the transfer function:

$$\frac{E_2}{E_1}=\frac{S^2}{S^2+(\alpha\omega_1+\gamma\omega_2)S+\omega_1\omega_2}$$

where $E_2$ = the input signal of the filter
$E_1$ = the output signal of the filter
$S$ = the complex frequency $\alpha=1-\beta$ $$\gamma=1+\frac{C_1}{C_2}$$

$$\omega_1=\frac{1}{R_1C_1}$$

$$\omega_2=\frac{1}{R_2C_2}$$

$\beta$ = the amplification of the emitter follower, i.e. determines the amplitude of the signal fed back via the resistance R1.

By replacing the resistor R1 in this filter by two resistors R1′ and R1″ connected to the connection point of the capacitors and feeding back these resistors to points in the output circuit of the amplifier where the amplifications are supposed to be $\beta'$ and $\beta''$. This implies that in the above expression the term $\omega_1$ is replaced by $\omega_1'+\omega_1''$ and the term $\beta\omega_1$ is replaced by $\alpha'\omega_1'+\alpha''\omega_1''$ where $$\omega_1'=\frac{1}{R_1'C_1'}\quad \omega_1''=\frac{1}{R_1''C_1},\quad \alpha'=1-\beta',\text{ and}$$

$\alpha''=1-\beta''$ $\beta''=1$ i.e. $\alpha''=0$ the following transfer function is obtained:

$$\frac{E_2}{E_1}=\frac{S^2}{S^2+(\alpha'K_1+K_2)S+K_3}$$

where $$K_1=\frac{1}{R_1'C_1}$$

$$K_2=\left(1+\frac{C_2}{C_1}\right)\frac{1}{R_2C_2}$$

$$K_3=\frac{1}{C_1C_2R_2}\left(\frac{1}{R_1'}+\frac{1}{R_1''}\right)$$

The poles of the transfer function, i.e. the zeros of the denominator will be:

$$s_1=-\frac{(\alpha^1K_1+K_2)}{2}+j\sqrt{K_3\left(\frac{\alpha_1K_1+K_2}{2}\right)}$$

and $$s_2=-\frac{(\alpha'K_1+K_2)}{2}-j\sqrt{K_3-\left(\frac{\alpha'K_1+K_2}{2}\right)^2}$$ If $\alpha'<-\frac{K_2}{K_1}$ the real parts of the poles will be positive, i.e. the poles will be in the right half of the complex frequency plane, implying that an oscillator is obtained. The oscillation is of course maintained even if the input is short-circuited. The frequency of the oscillator will be equal to the sum of the imaginary parts of the poles, i.e.

$$\sqrt{K_3-\left(\frac{\alpha'K_1+K_2}{2}\right)^2}$$

In this expression $$\left(\frac{\alpha'K_1+K_2}{2}\right)^2$$

can be neglected in comparison with $K_3$ since $$\left(\frac{\alpha'K_1+K_2}{2}\right)^2$$

is chosen to have a small value which is explained in detail below. The frequency is consequently:

$$\sqrt{\frac{1}{C_2R_2C_1}\left(\frac{1}{R_1'}+\frac{1}{R_1''}\right)}$$

and can be varied continuously by varying any of the passive elements. Of the passive elements, resistor $R_1''$ is, however, not included in the real parts of the poles $s_1$, $s_2$. Therefore if the frequency is varied by changing this resistor, the poles will be moved in parallel with the imaginary axis of the complex frequency plane. Since the harmonic distortion of the oscillator depends on the distance of the poles from the imaginary axis and increases as this distance increases, the frequency can consequently be varied by varying resistor $R_1''$ thus providing an oscillator, the frequency of which varies continuously with a constant harmonic distortion. In order to make the harmonic distortion small the distance between the poles and the imaginary axis shall be small i.e.

$$\frac{\alpha'K_1+K_2}{2}$$

shall be small, which explains the approximation above.

An oscillator according to the above-described principle is shown in FIG. 2 in which the components which are common with FIG. 1 have the same reference characters. In the oscillator the sole emitter follower has in accordance with FIG. 1 been exchanged for an emitter follower including two transistors T1 and T2 with the collector of the transistor T1 being connected to the base of the transistor T2. Moreover, two resistors R3 and R4 have been connected between the emitter of the transistor T1 and the collector of the transistor T2, whereby it is assumed that the amplification at the connection point of the resistors R3 and R4 to which the variable resistance $R_1''$ is connected, is 1, while the amplification at the collector of the transistor T2 to which the resistance $R_1'$ is connected, will be $$1+\frac{R_4}{R_3+R_e}$$

i.e. is larger than 1. The value of $\alpha'$ is consequently $$1-\left(1+\frac{R_4}{R_3+R_e}\right)=-\frac{R_4}{R_3+R_e}$$

i.e. in order to satisfy the above-mentioned condition $$\alpha'<-\frac{K_2}{K_1}$$

the equation $$\frac{R_4}{R_3+R_e}>\frac{K_2}{K_1}=\frac{C_1R_1'}{R_2}\left(\frac{1}{C_1}+\frac{1}{C_2}\right)$$

must be satisfied.

The frequency of an oscillator dimensioned in accordance with the above-mentioned equation can consequently be varied within a wide range with a constant harmonic distortion within the range.

We claim:

1. An oscillator whose frequency can be varied without increasing harmonic distortion comprising an amplifier stage having one input with a large input impedance and two outputs with small output impedances, the amplification at the first output being equal to one, the amplification at the second output being greater than one, a first resistor connecting said input to ground, first and second serially connected capacitors connecting said input to ground, a second resistor connecting the junction of said capacitors to said first output, and a third resistor connecting the junction of said capacitors to said second output, said second resistor being variable for changing the frequency of oscillations, and the output of the oscillator being one of the two outputs of said amplifier stage.